(12) United States Patent
Cheng (10) Patent No.: US 12,543,407 B2
(45) Date of Patent: Feb. 3, 2026

(54) SEMICONDUCTOR LIGHT-EMITTING DEVICE AND PREPARATION METHOD THEREOF (71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 561 days.

(21) Appl. No.: 18/061,621

(22) Filed: Dec. 5, 2022

(65) Prior Publication Data

US 2023/0109404 A1 Apr. 6, 2023

Related U.S. Application Data

(63) Continuation of application No. PCT/CN2020/132208, filed on Nov. 27, 2020.

(51) Int. Cl.
*H10H 20/814* (2025.01)
*H10H 20/01* (2025.01)
(Continued)

(52) U.S. Cl.
CPC .... *H10H 20/8142* (2025.01); *H10H 20/0137* (2025.01); *H10H 20/817* (2025.01); *H01S 5/18361* (2013.01); *H01S 5/34* (2013.01)

(58) Field of Classification Search
CPC .......... H10H 20/8142; H10H 20/0137; H10H 20/817; H10H 20/01; H10H 20/032;
(Continued)

(56) References Cited

U.S. PATENT DOCUMENTS 5,539,759 A * 7/1996 Chang-Hasnain .......................... H01S 5/18355
372/98
6,222,866 B1 4/2001 Seko
(Continued)

FOREIGN PATENT DOCUMENTS

CN 1136720 A 11/1996
CN 105609602 A 5/2016
(Continued)

OTHER PUBLICATIONS

International Search Report issued in corresponding PCT Application No. PCT/CN2020/132208, dated Aug. 27, 2021.
(Continued)

*Primary Examiner* — Sitaramarao S Yechuri
(74) *Attorney, Agent, or Firm* — Westbridge IP LLC (57) ABSTRACT

Disclosed are a semiconductor light-emitting device and a preparation method of the semiconductor light-emitting device. The preparation method of the semiconductor light-emitting device includes: forming a mask layer on a substrate, the mask layer is provided with a plurality of openings exposing the substrate; etching the substrate at each of the plurality of openings to form a first groove, and forming a first reflector in the first groove; epitaxially growing a light-emitting structure on the first reflector, and the light-emitting structure includes a first conductive type semiconductor layer, a multiple quantum well layer and a second conductive type semiconductor layer epitaxial grown in sequence; forming a second reflector in one side of the light-emitting structure away from the first reflector.

18 Claims, 5 Drawing Sheets

(51) Int. Cl.
*H10H 20/817* (2025.01)
*H01S 5/183* (2006.01)
*H01S 5/34* (2006.01)

(58) Field of Classification Search
CPC ............. H10H 20/0363; H10H 20/816; H10H 20/833; H10H 20/856; H01S 5/18361; H01S 5/34; H01S 5/04257; H01S 5/18341; H01S 5/18311; H01L 25/0753
See application file for complete search history.

(56) References Cited

U.S. PATENT DOCUMENTS

| | | | | |
|---|---|---|---|---|
| 6,266,355 | B1* | 7/2001 | Sverdlov | ................ B82Y 20/00 |
| | | | | 372/45.01 |
| 6,342,404 | B1* | 1/2002 | Shibata | ............ H10H 20/01335 |
| | | | | 257/E21.127 |
| 2004/0081215 | A1 | 4/2004 | Johnson et al. | |
| 2004/0131101 | A1* | 7/2004 | Albrecht | ................. H01S 3/092 |
| | | | | 372/50.1 |
| 2008/0179605 | A1* | 7/2008 | Takase | ............... H10H 20/8142 |
| | | | | 257/E33.068 |
| 2011/0108956 | A1* | 5/2011 | Haase | ................... H10F 77/703 |
| | | | | 257/618 |
| 2011/0121330 | A1* | 5/2011 | Tak | ................... H01L 21/02439 |
| | | | | 438/47 |
| 2013/0221368 | A1* | 8/2013 | Oraw | ..................... H10H 29/10 |
| | | | | 257/89 |
| 2018/0006645 | A1* | 1/2018 | Kondo | ..................... H10F 55/18 |
| 2021/0091538 | A1* | 3/2021 | Chen | ..................... H01S 5/0239 |
| 2021/0119075 | A1* | 4/2021 | Charles | ............ H10H 20/01335 |

FOREIGN PATENT DOCUMENTS

| | | |
|---|---|---|
| CN | 106848016 A | 6/2017 |
| CN | 107833878 A | 3/2018 |
| CN | 109979960 A | 7/2019 |
| DE | 102012015309 A1 | 2/2013 |
| JP | 2004031657 A | 1/2004 |
| KR | 100891800 B1 | 4/2009 |

OTHER PUBLICATIONS

First Office Action issued in counterpart Chinese Patent Application No. 202080107496.6, dated Apr. 16, 2025.
Second Office Action issued in counterpart Chinese Patent Application No. 202080107496.6, dated Oct. 1, 2025.

* cited by examiner

SEMICONDUCTOR LIGHT-EMITTING DEVICE AND PREPARATION METHOD THEREOF

CROSS-REFERENCE TO RELATED APPLICATIONS

This application is a continuation of International Application No. PCT/CN2020/132208, filed on Nov. 27, 2020, the disclosure of which is hereby incorporated by reference in its entirety.

TECHNICAL FIELD

The present disclosure relates to the technical field of semiconductors, and in particular, to a semiconductor light-emitting device and a preparation method of the semiconductor light-emitting device.

BACKGROUND

In recent years, a semiconductor light-emitting device, as a new generation of green light source, is widely used in lighting, backlighting, display, indication and other fields.

In order to improve the performance of the semiconductor light-emitting device, a resonant chamber is often formed in the semiconductor light-emitting device. In the preparation process of semiconductor light-emitting device with the resonant chamber, a first reflector, a light-emitting structure and a second reflector are often formed on the substrate in sequence. However, in order to form a plurality of semiconductor light-emitting devices, the first reflector needs to be patterned, and the preparation process is complicated.

SUMMARY

The purpose of the present disclosure is to provide a semiconductor light-emitting device and a preparation method of the semiconductor light-emitting device, which can simplify the preparation process.

According to one aspect of the present disclosure, a preparation method of a semiconductor light-emitting device is provided, including:

forming a mask layer on a substrate, the mask layer being provided with a plurality of openings exposing the substrate;

etching the substrate at each of the plurality of openings to form a first groove, and forming a first reflector in the first groove;

epitaxially growing a light-emitting structure on the first reflector, the light-emitting structure including a first conductive type semiconductor layer, a multiple quantum well layer and a second conductive type semiconductor layer epitaxially grown in sequence;

forming a second reflector on one side of the light-emitting structure facing away from the first reflector.

Optionally, before the forming a first reflector in the first groove, the preparation method further includes:

forming a dielectric layer on the first groove and the mask layer conformally;

removing the dielectric layer from a horizontal bottom surface of the first groove to expose a bottom surface of the first groove.

Optionally, after the forming a second reflector, the preparation method further includes:

forming a first electrode electrically connected to the first conductive type semiconductor layer and a second electrode electrically connected to the second conductive type semiconductor layer.

Optionally, the preparation method further includes:

forming a second groove on one side of the semiconductor light-emitting device facing away from the substrate, where the second groove exposes one side of the first conductive type semiconductor layer facing away from the substrate;

arranging a first electrode on the first conductive type semiconductor layer in the second groove, and forming a second electrode electrically connected to the second conductive type semiconductor layer.

Optionally, the preparation method further includes: arranging a third groove extending to the first conductive type semiconductor layer on a back of the substrate; and arranging a first electrode electrically connected to the first conductive type semiconductor layer in the third groove.

Optionally, the first reflector has electrical conductivity, and the preparation method further includes: arranging a third groove extending to the first reflector on a back of the substrate; and arranging a first electrode electrically connected to the first reflector in the third groove.

Optionally, the first reflector is a porous conductive structure, and the porous conductive structure includes a first porous conductive layer and a second porous conductive layer stacked alternately and formed after electrochemical corrosion, a plurality of first holes are formed in the first porous conductive layer, a plurality of second holes are formed in the second porous conductive layer, and a diameter of each of the plurality of first holes is different from a diameter of each of the plurality of second holes.

Optionally, the second reflector is Bragg reflector, before the forming a second reflector, the preparation method further includes:

forming an ITO layer on one side of the light-emitting structure facing away from the first reflector, and the second reflector is formed on a surface of the ITO layer facing away from the first reflector.

Optionally, a plurality of the light-emitting structures share the second electrode.

Optionally, a surface of the light-emitting structure facing away from the first reflector is aligned with a surface of the mask layer facing away from the substrate, a plurality of the light-emitting structures share an ITO layer.

Optionally, the light-emitting structure includes an oxide layer, and the oxide layer includes a low-resistance area and a high-resistance area surrounding the low-resistance area.

Another aspect of the present disclosure provides a semiconductor light-emitting device, the semiconductor light-emitting device is prepared by the above-mentioned preparation method of the semiconductor light-emitting device.

In the semiconductor light-emitting device and the preparation method of the semiconductor light-emitting device of the present disclosure, a mask layer is formed on a substrate, and the mask layer is provided with a plurality of openings exposing the substrate; the substrate is etched at each of the plurality of openings to form a first groove, a first reflector is formed in the first groove; the light-emitting structure is epitaxially grown in the first reflector, and the light-emitting structure includes a first conductive type semiconductor layer, a multiple quantum well layer and a second conductive type semiconductor layer epitaxial growth in sequence; a second reflector is formed on one side of the light-emitting structure facing away from the first reflector. First reflectors are formed in first grooves to form a plurality of first reflectors arranged at intervals, and the patterning step of the first reflector is no longer required, which simplifies the preparation process of the semiconductor light-emitting device. In the alternative, because a dielectric layer is added to the sidewall, a material of the dielectric layer is different from a material of the substrate, so the subsequent epitaxial structure is difficult to grow on the sidewall of the first groove, thereby reducing the stress of subsequent epitaxial structure, which is beneficial to improve the performance of the semiconductor light-emitting device of this embodiment.

DETAILED DESCRIPTIONS OF THE EMBODIMENTS

Exemplary embodiments will be described in detail and are illustrated in the accompanying drawings. The following description refers to the drawings, the same numerals in different drawings refer to the same or similar elements unless otherwise indicated. The implementations described in the following exemplary embodiments are not intended to represent all implementations consistent with this disclosure. Rather, they are merely embodiments consistent with some aspects of the present disclosure, as recited in the appended claims.

First Embodiment

Figure 1:
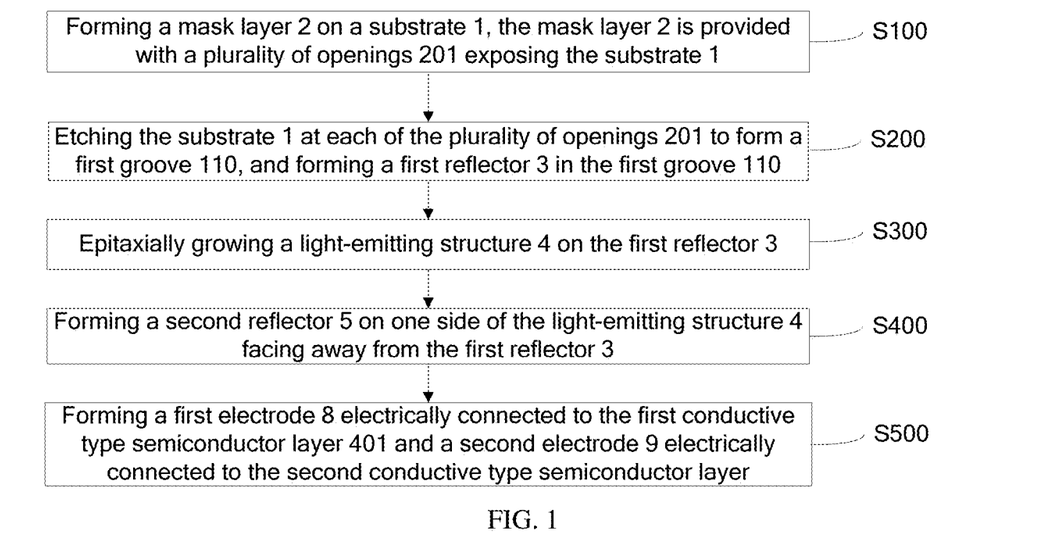
FIG. 1 is a flow chart of a preparation method of a semiconductor light-emitting device of a first embodiment of the present disclosure.

The first embodiment of the present disclosure provides a semiconductor light-emitting device and a preparation method of the semiconductor light-emitting device. As shown in FIG. 1, the preparation method of the semiconductor light-emitting device may include steps S100 to S400.

Step S100: forming a mask layer 2 on a substrate 1, the mask layer 2 is provided with a plurality of openings 201 exposing the substrate.

Step S200: etching the substrate 1 at each of the plurality of openings 201 to form a first groove 110, and forming a first reflector 3 in the first groove 110.

Step S300: epitaxially growing a light-emitting structure 4 on the first reflector 3, the light-emitting structure 4 includes a first conductive type semiconductor layer 401, a multiple quantum well layer 402 and a second conductive type semiconductor layer 403 grown epitaxially in sequence;

Step S400: forming a second reflector 5 on one side of the light-emitting structure 4 facing away from the first reflector 3.

In the preparation method of semiconductor light-emitting device of the first embodiment of the present disclosure, the mask layer 2 is provided with a plurality of openings 201, and are etched to form a plurality of first grooves 110 at the plurality of openings 201. The first reflector 3 is formed in each of the plurality of first grooves 110, and first reflectors 3 are spaced apart from each other, eliminating the need for a patterning step of the first reflector, which simplifies the preparation process of the semiconductor light-emitting device.

Figure 2:
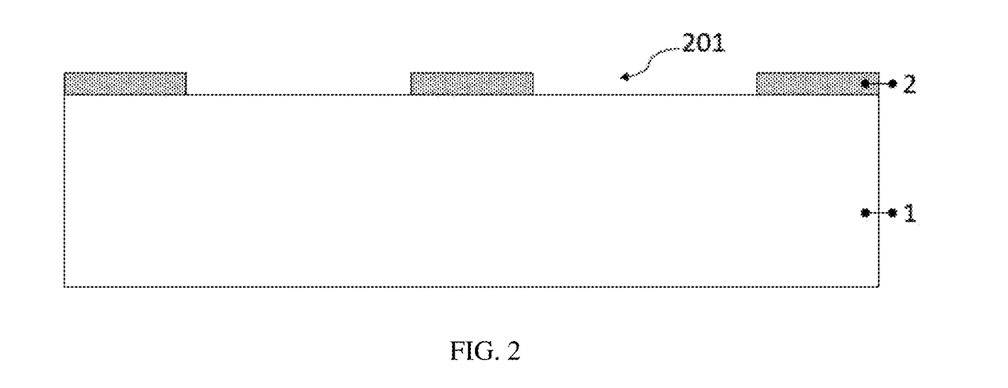
FIG. 2 is a schematic structural diagram of a semiconductor light-emitting device after completion of step S100 of the preparation method of the semiconductor light-emitting device according to the first embodiment of the present disclosure.

The steps of the preparation method of the semiconductor light-emitting device in the first embodiment of the present disclosure will be described in detail below:

In step S100, a mask layer 2 is formed on a substrate 1, and the mask layer 2 is provided with a plurality of openings 201 exposing the substrate.

As shown in FIG. 2, the substrate 1 may be a III-V or II-VI semiconductor material. For example, the substrate 1 may be a silicon substrate. The substrate 1 may also be a silicon carbide substrate, but the embodiment of the present disclosure is not limited thereto, and the substrate 1 may also be a sapphire substrate. The substrate 1 may also be a composite substrate, for example, epitaxial gallium nitride on silicon carbide forms a gallium nitride-silicon carbide composite substrate, and epitaxial silicon arsenide on germanium forms a silicon arsenide-germanium composite substrate. The composite substrate alleviates problems of lattice mismatch and thermal mismatch of an ordinary sapphire substrates used to grow a GaN-based semiconductor material, thereby reducing the cost of existing GaN-based semiconductor growth substrates, and improving subsequent growth quality of the light-emitting structure of GaN-based semiconductor materials.

A material of the mask layer 2 may be silicon oxide, such as $SiO_2$. In a thickness direction of the mask layer 2, the opening 201 penetrates the mask layer 2. The number of the openings 201 may be two, four or more, and multiple openings 201 are arranged at intervals. For example, step S100 may include: forming a dielectric material layer on a substrate 1; patterning the dielectric material layer to form a mask layer 2, the mask layer 2 is provided with the opening 201 exposing the substrate 1. The dielectric material layer may be prepared by vapor deposition, and may also be prepared by other methods. In the embodiments of the present disclosure, the dielectric material layer may be patterned through a photolithography process.

Figure 3:
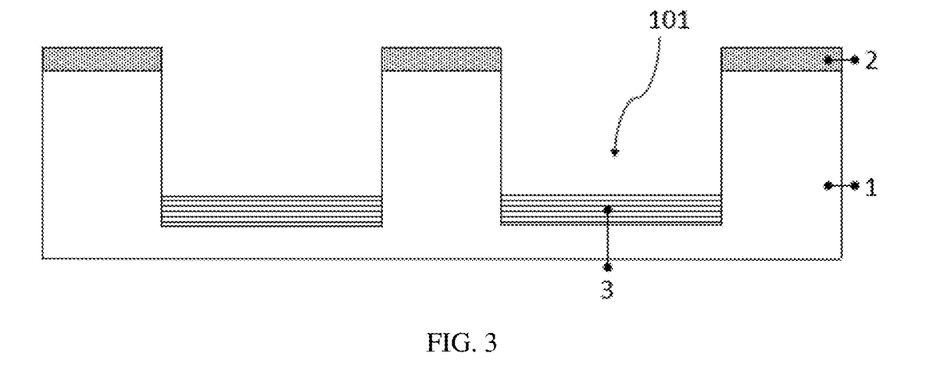
FIG. 3 is a schematic structural diagram of a semiconductor light-emitting device after completion of step S200 of the preparation method of the semiconductor light-emitting device according to the first embodiment of the present disclosure.

In step S200, the substrate 1 is etched at the opening 201 to form a first groove 110, and a first reflector 3 is formed in the first groove 110.

Figure 4:
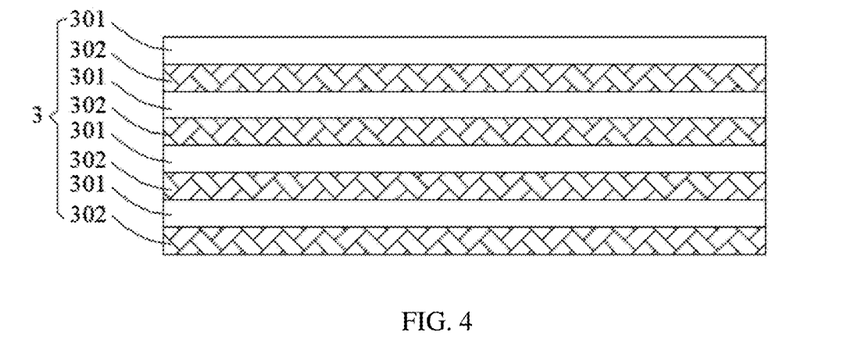
FIG. 4 is a schematic diagram of a first reflector in the semiconductor light-emitting device of the first embodiment of the present disclosure.

As shown in FIG. 3, in the embodiment of the present disclosure, the substrate 1 may be epitaxially grown by atomic layer deposition, and may also be epitaxially grown by chemical vapor deposition, the embodiment of the present disclosure is not limited thereto. The first reflector 3 may be a Bragg reflector. Furthermore, the first reflector 3, which is the Bragg reflector, may be a porous conductive structure. As shown in FIG. 4, the porous conductive structure may include first porous conductive layers 301 and second porous conductive layers 302 alternately stacked and formed after electrochemical corrosion. A plurality of first holes may be formed in the first porous conductive layer 301, and a plurality of second holes may be formed in the second porous conductive layer 302, and a diameter of each of the plurality of first holes and a diameter of each of the plurality of second holes may be different. The difference in refractive index between the first porous conductive layer 301 and the second porous conductive layer 302 is large, which improves the reflectivity of the first reflector 3. A material of the first reflector 3 may be a III-V group semiconductor material. Taking the first reflector 3 including first porous conductive layers 301 and second porous conductive layers 302 alternately stacked as an example, the first porous conductive layers 301 and the second porous conductive layers 302 are both made of gallium nitride-based materials. For example, a material of the first porous conductive layer 301 is n-type GaN or n-type AlInGaN, and a material of the second porous conductive layer 302 is u-type GaN or u-type AlInGaN. In addition, in the embodiment of the present disclosure, a buffer layer may be formed in each opening 101 of the first groove110 before forming the first reflector 3, the first reflector 3 is formed on one side of the buffer layer facing away from the substrate 1. In actual operation, the first groove 110 may be implemented by dry etching or wet etching. The dry etching may be Inductively Coupled Plasma (ICP) etching. An etching gas may include: $Cl_2$ and $BCl_3$. An etching solution for wet etching may be $H_3PO_4$ solution or KOH solution.

Figure 5:
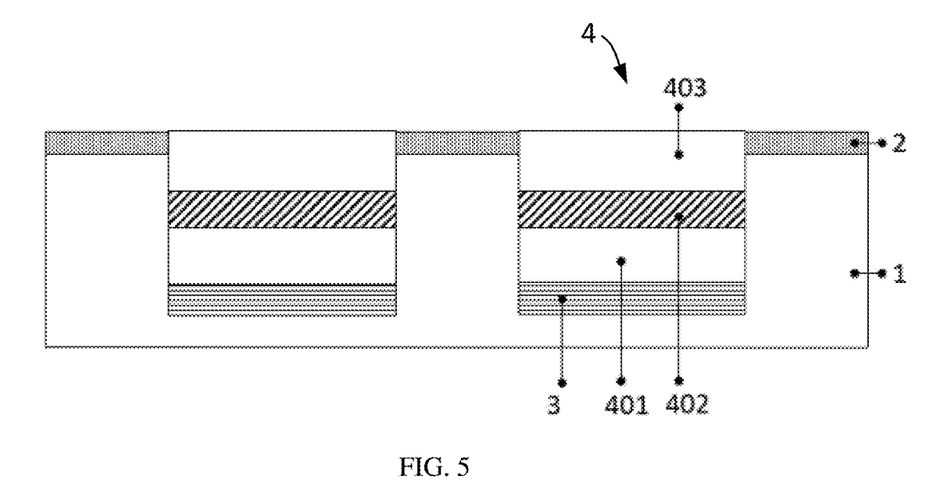
FIG. 5 is a schematic structural diagram of a semiconductor light-emitting device after completion of step S300 of the preparation method of the semiconductor light-emitting device according to the first embodiment of the present disclosure.

In step S300, a light-emitting structure 4 is epitaxially grown on the first reflector 3, and the light-emitting structure 4 includes a first conductive type semiconductor layer 401, a multiple quantum well layer 402 and a second conductive type semiconductor layer 403 grown epitaxially in sequence.

As shown in FIG. 5, the light-emitting structure 4 may include a first conductive type semiconductor layer 401, an active layer 402 and a second conductive type semiconductor layer 403 stacked alternatively. The active layer 402 may be at least one of a single quantum well structure, a multiple quantum well (MQW) structure, a quantum wire structure and a quantum dot structure. Taking the active layer 402 being a multiple quantum well structure as an example, the active layer 402 may include alternately stacked potential well layers and potential barrier layers. The first conductivity type is different from the second conductivity type. The first conductive type semiconductor layer 401 may be a p-type semiconductor layer, and the second conductive type semiconductor layer 403 may be an n-type semiconductor layer, the embodiments of the present disclosure are not particularly limited thereto. In addition, the surface of each light-emitting structure 4 arranged in each opening 201 facing away from the substrate 1 may be aligned with the surface of the mask layer 2 facing away from the substrate 1.

Figure 6:
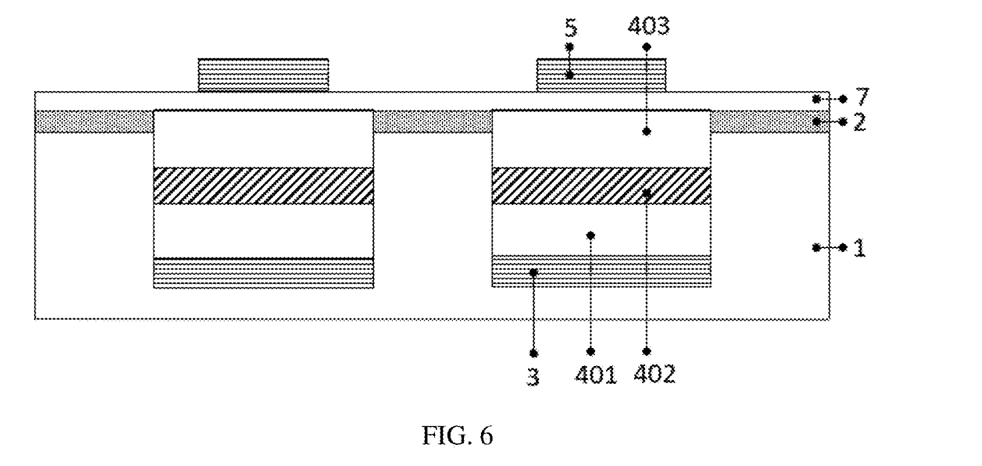
FIG. 6 is a schematic structural diagram of a semiconductor light-emitting device after completion of step S400 of the preparation method of the semiconductor light-emitting device according to the first embodiment of the present disclosure.

In step S400, a second reflector 5 is formed on one side of the light-emitting structure 4 facing away from the first reflector 3.

As shown in FIG. 6, a reflectivity of the second reflector 5 may be smaller than that of the first reflector 3, and the embodiments of the present disclosure are not limited thereto. The second reflector 5 may be a Bragg reflector, and the material is at least one group of multi-period materials selected from the group consisting of $TiO_2/SiO_2$, $Ti_3O_5/SiO_2$, $Ta_2O_5/SiO_2$, $Ti_3O_5/Al_2O_3$, $ZrO_2/SiO_2$ or $TiO_2/Al_2O_3$, and the embodiment of the present disclosure is not limited thereto. Before forming the second reflector 5, this embodiment may further include: forming an ITO layer 7 on one side of the light-emitting structure 4 facing away from the first reflector 3. The second reflector 5 is formed on one surface of the ITO layer 7 facing away from the first reflector 3. Taking the surface of each light-emitting structure 4 facing away from the substrate 1 being aligned with the surface of the mask layer 2 facing away from the substrate 1 as an example, a plurality of light-emitting structures 4 may share one ITO layer 7.

After the second reflector 5 is formed, as shown in FIG. 1, the preparation method of the embodiment of the present disclosure may further include the following steps.

Step S500: forming a first electrode 8 electrically connected to the first conductive type semiconductor layer 401 and a second electrode 9 electrically connected to the second conductive type semiconductor layer.

Figure 7:
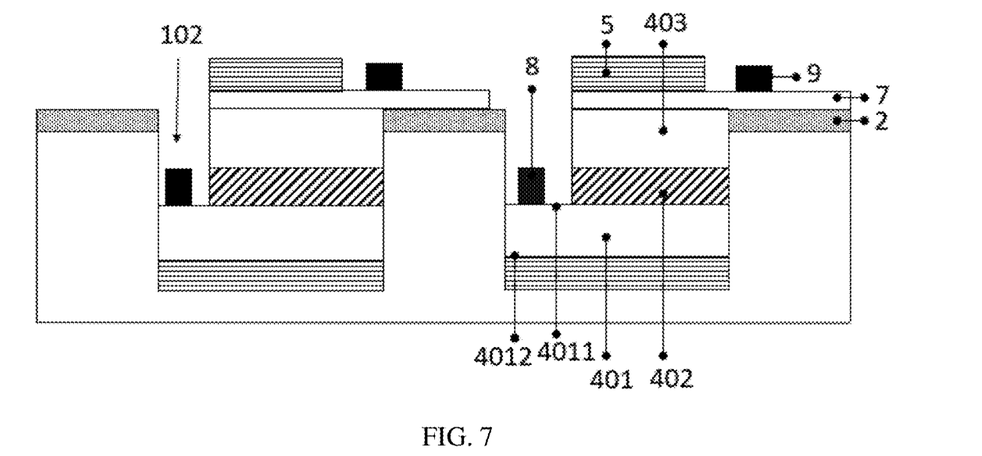
FIG. 7 is a schematic structural diagram of a semiconductor light-emitting device after completion of step S500 of the preparation method of the semiconductor light-emitting device according to the first embodiment of the present disclosure.

As shown in FIG. 7, the first conductive type semiconductor layer 401 has a first side surface 4011 and a second side surface 4012, the first side surface 4011 is one surface facing away from the substrate 1, and the second side surface 4012 is the other surface close to the substrate 1. A conductive groove 102 is arranged on the side of the semiconductor light-emitting device facing away from the substrate 1, and the second groove102 exposes the first side surface 4011 of the first conductive type semiconductor layer 401 facing away from the substrate 1; the first electrode 8 is arranged on the first type semiconductor layer 401 in the second groove 102, that is, the first electrode 8 is arranged on the first side surface 4011 of the first conductive type semiconductor layer 401, and the second electrode 9 electrically connected to the second conductive type semiconductor layer is formed. A plurality of light-emitting structures 4 may share the second electrode 9, and the second electrode 9 may be in contact with the ITO layer 7.

Second Embodiment

Figure 8:
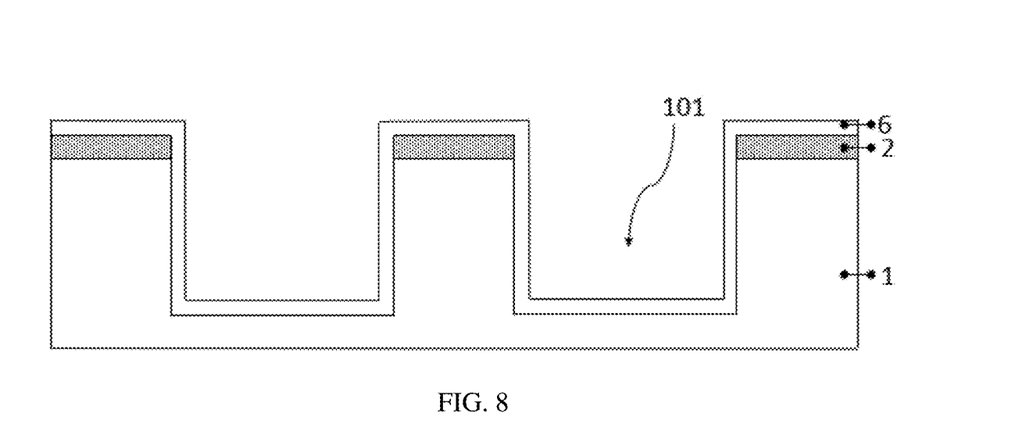
FIG. 8 is a schematic structural diagram of a semiconductor light-emitting device after completion of step S220 of the preparation method of semiconductor light-emitting device according to the second embodiment of the present disclosure.
Figure 9:
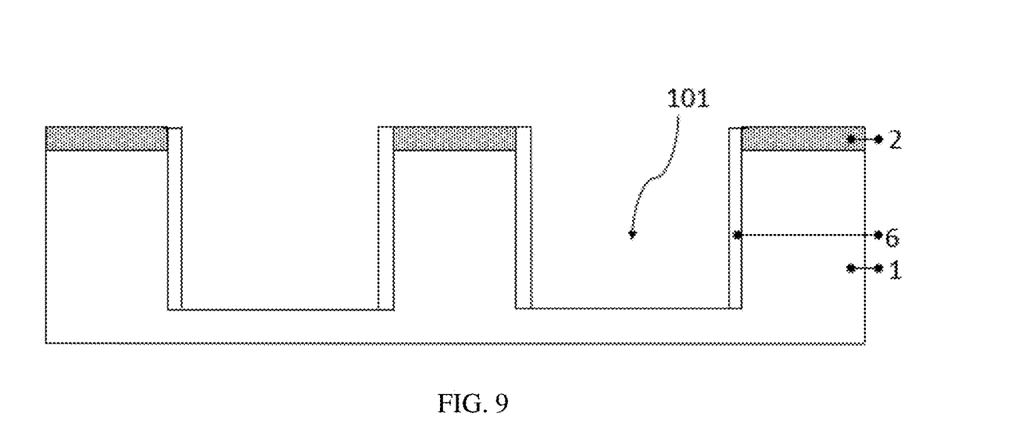
FIG. 9 is the schematic structural diagram of a semiconductor light-emitting device after the completion of step S230 of the preparation method of semiconductor light-emitting device according to a second embodiment of the present disclosure.

The preparation method of the semiconductor light-emitting device and the semiconductor light-emitting device in the second embodiment of the present disclosure is substantially the same as the preparation method of the semiconductor light-emitting device and the semiconductor light-emitting device in the first embodiment of the present disclosure, and the difference is only in that the step S200 includes:

S210: etching the substrate 1 at an opening 201 to form a first groove 101;

S220: forming a dielectric layer 6 on the first groove 101 and the mask layer 2 conformally;

S230: removing the dielectric layer 6 from a horizontal bottom of the first groove 101, and retaining the dielectric layer 6 on a sidewall of the first groove 101;

S240: forming the first reflector 3 in the first groove 101.

As shown in FIG. 8, before forming the first reflector 3 in the first groove 101, the preparation method further includes: forming a dielectric layer 6 on the first groove 101 and the mask layer 2 conformally; as shown in FIG. 9, the dielectric layer on the horizontal bottom of the first groove 101 is removed, because a thickness of the dielectric layer 6 on the horizontal bottom of the first groove 101 is smaller than a thickness of the dielectric layer 6 on the sidewall of first groove 101, so the dielectric layer 6 on the horizontal bottom surface of first groove 101 is easily removed by the method of etching, and the dielectric layer 6 on the sidewall of the first groove 101 is retained. Compared with the first embodiment, the dielectric layer 6 is added to the sidewall in the second embodiment, and the material of the dielectric layer 6 and the material of the substrate 1 is different. Therefore, it is difficult for the subsequent epitaxial structure to grow on the sidewall of the first groove 101, thereby reducing the stress in the subsequent epitaxial structure, which is beneficial to improve the performance of the semiconductor light-emitting device of this embodiment.

Third Embodiment

Figure 10:
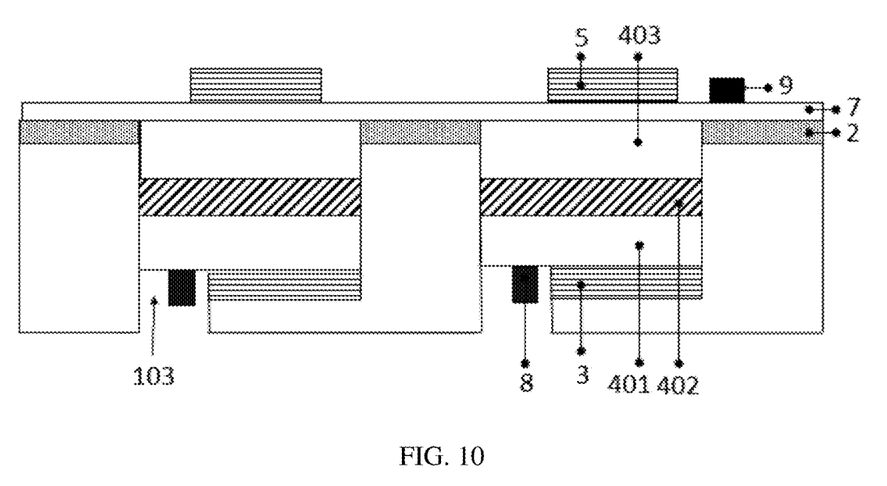
FIG. 10 is a schematic structural diagram of a semiconductor light-emitting device according to a third embodiment of the present disclosure.

The preparation method of the semiconductor light-emitting device and the semiconductor light-emitting device in the third embodiment of the present disclosure is substantially the same as the preparation method of the semiconductor light-emitting device and the semiconductor light-emitting device in the first or second embodiment of the present disclosure, and the difference is: as shown in FIG. 10, the positions of the first electrode 8 are different, a third groove 103 extending to the first conductive type semiconductor layer is arranged on a back of the substrate 1, and the first electrode 8 is arranged in the third groove 103 to be electrically connected to the first conductive type semiconductor layer 401. In this embodiment, if the first reflector 3 has conductivity, for example, the first reflector 3 is a metal reflector, or the first reflector 3 is a porous conductive structure, the above-mentioned third groove 103 is formed on the back of the substrate 1 and extend to the first reflector 3, and the first electrode 8 is arranged in the third groove 103 to be electrically connected to the first reflector 3.

The semiconductor light-emitting device in the first, second and third embodiments of the present disclosure may be a resonant chamber LED. Taking the first conductive type semiconductor layer 401 being a p-type semiconductor layer and the second conductive type semiconductor layer 403 being an n-type semiconductor layer as an example, the first electrode 8 is a p-type electrode, and the second electrode 9 is an n-type electrode. Both the material of the first electrode 8 and the material of the second electrode 9 may be at least one selected from gold, silver, aluminum, chromium, nickel, platinum, and titanium.

Fourth Embodiment

Figure 11:
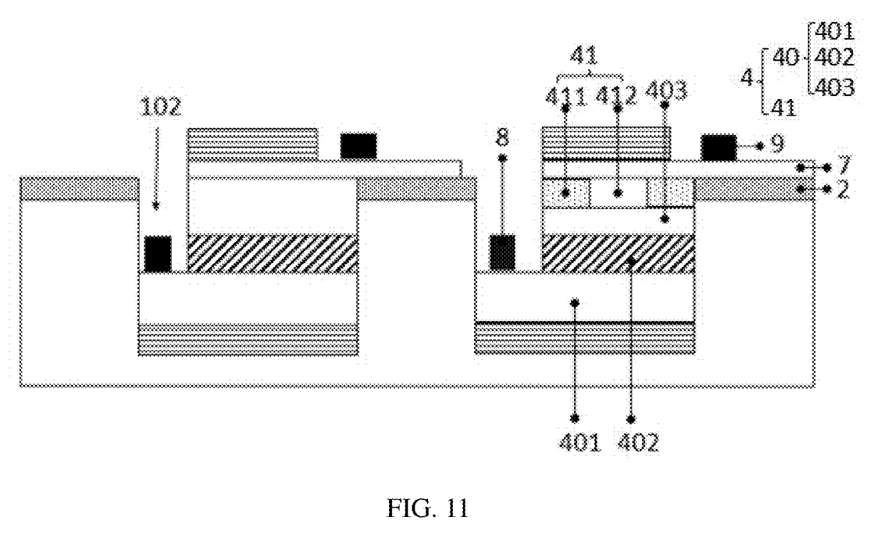
FIG. 11 is a schematic structural diagram of a semiconductor light-emitting device according to a fourth embodiment of the present disclosure.

The preparation method of the semiconductor light-emitting device and the semiconductor light-emitting device in the fourth embodiment of the present disclosure is substantially the same as the preparation method of the semiconductor light-emitting device and the semiconductor light-emitting device in the first to third embodiments of the present disclosure, and the difference is only in light-emitting structure. As shown in FIG. 11, the light-emitting structure 4 of the fourth embodiment of the present disclosure may include an light-emitting layer 40 and an oxide layer 41. The oxide layer 41 may be stacked on the light-emitting layer 40. The oxide layer 41 may include a low-resistance region 412 and a high-resistance region 411. The high-resistance region 411 surrounds the low-resistance region 412, and the low-resistance region forms a current aperture, that is, an internal current window, so that the light emitting device of the fourthembodiment of the present disclosure constitutes a Vertical Chamber Surface Emitting Laser (VCSEL). The low-resistance region also forms an optical path of the Vertical Chamber Surface Emitting Laser.

As shown in FIG. 11, taking the light-emitting layer 40 including a first conductive type semiconductor layer 401, an active layer 402 and a second conductive type semiconductor layer 403 stacked alternatively as an example, an oxide layer 41 may also be arranged on one side of the second conductive type semiconductor layer 403 facing away from the active layer 402. In addition, the oxide layer 41 may also be arranged in the active layer 402. The number of the oxide layers 41 may be multiple. Taking the number of oxide layers 41 being two as an example, one oxide layer 41 may be arranged in the active layer 402, and the other oxide layer 41 may be arranged on a side of the second conductive type semiconductor layer 403 facing away from the active layer 402. The oxide layer 41 in the embodiment of the present disclosure may be obtained by oxidizing a single-layer structure of AlInN, AlGaAs, AlAs, or AlN, or by oxidizing AlInN/GaN, AlN/GaN, AlGaAs/GaN, or AlAs/GaN.

The above description is only the preferred embodiment of the present disclosure, and does not limit the present disclosure in any form. Although the present disclosure has been disclosed as above in the preferred embodiment, it is not intended to limit the present disclosure. A person skilled in the art can make some changes or modifications of equivalent embodiments by using the technical content disclosed above within the scope of the technical solutions of the present disclosure. Provided that any content that does not depart from the technical solutions of the present disclosure, any simple modifications, equivalent changes and modifications made to the above embodiments by the technical essence of the present disclosure still fall within the scope of the technical solutions of the present disclosure.

The invention claimed is:

1. A preparation method of a semiconductor light-emitting device, comprising:
    forming a mask layer on a substrate, the mask layer being provided with a plurality of openings exposing the substrate;
    etching the substrate at each of the plurality of openings to form a first groove, and forming a first reflector in the first groove; wherein the first reflector is a porous conductive structure comprising a first porous conductive layer and a second porous conductive layer stacked alternately and formed after electrochemical corrosion; wherein a plurality of first holes are formed in the first porous conductive layer, a plurality of second holes are formed in the second porous conductive layer, and a diameter of each of the plurality of first holes is different from a diameter of each of the plurality of second holes;
    epitaxially growing a light-emitting structure on the first reflector, the light-emitting structure comprising a first conductive type semiconductor layer, a multiple quantum well layer and a second conductive type semiconductor layer epitaxially grown in sequence; and forming a second reflector on one side of the light-emitting structure facing away from the first reflector.

2. The preparation method of a semiconductor light-emitting device according to claim 1, wherein before the forming a first reflector in the first groove, the preparation method further comprises:

forming a dielectric layer on the first groove and the mask layer conformally;

removing the dielectric layer from a horizontal bottom surface of the first groove to expose a bottom surface of the first groove.

3. The preparation method of a semiconductor light-emitting device according to claim 1, wherein after the forming a second reflector, the preparation method further comprises:

forming a first electrode electrically connected to the first conductive type semiconductor layer and a second electrode electrically connected to the second conductive type semiconductor layer.

4. The preparation method of a semiconductor light-emitting device according to claim 3, further comprising:

forming a second groove on one side of the semiconductor light-emitting device facing away from the substrate, wherein the second groove exposes one side of the first conductive type semiconductor layer facing away from the substrate, and the first electrode is arranged on the first conductive type semiconductor layer in the second groove.

5. The preparation method of a semiconductor light-emitting device according to claim 3, further comprising:

arranging a third groove extending to the first conductive type semiconductor layer on a back of the substrate, wherein the first electrode is arranged in the third groove and is electrically connected to the first conductive type semiconductor layer.

6. The preparation method of a semiconductor light-emitting device according to claim 3, wherein the first reflector has electrical conductivity, and the preparation method further comprises:

arranging a third groove extending to the first reflector on a back of the substrate, wherein the first electrode is arranged in the third groove and is electrically connected to the first reflector.

7. The preparation method of a semiconductor light-emitting device according to claim 3, wherein a plurality of the light-emitting structures share the second electrode.

8. The preparation method of a semiconductor light-emitting device according to claim 1, wherein the second reflector is Bragg reflector, and before the forming a second reflector, the preparation method further comprises:

forming an ITO layer on one side of the light-emitting structure facing away from the first reflector, wherein the second reflector is formed on a surface of the ITO layer facing away from the first reflector.

9. The preparation method of a semiconductor light-emitting device according to claim 8, wherein a surface of the light-emitting structure facing away from the first reflector is aligned with a surface of the mask layer facing away from the substrate, a plurality of the light-emitting structures share an ITO layer.

10. The preparation method of a semiconductor light-emitting device according to claim 1, wherein the light-emitting structure comprises an oxide layer, and the oxide layer comprises a low-resistance area and a high-resistance area surrounding the low-resistance area.

11. A semiconductor light-emitting device, wherein the semiconductor light-emitting device is prepared by the preparation method of a semiconductor light-emitting device according to claim 1.

12. A semiconductor light-emitting device, comprising:

a substrate;

a mask layer formed on the substrate, the mask layer being provided with a plurality of openings exposing the substrate;

a first groove formed by etching the substrate at each of the plurality of openings;

a first reflector formed in the first groove; wherein the first reflector is a porous conductive structure comprising a first porous conductive layer and a second porous conductive layer stacked alternately and formed after electrochemical corrosion; wherein a plurality of first holes are formed in the first porous conductive layer, a plurality of second holes are formed in the second porous conductive layer, and a diameter of each of the plurality of first holes is different from a diameter of each of the plurality of second holes;

a light-emitting structure epitaxially grown on the first reflector, the light-emitting structure comprising a first conductive type semiconductor layer, a multiple quantum well layer and a second conductive type semiconductor layer epitaxially grown in sequence;

a second reflector formed on one side of the light-emitting structure facing away from the first reflector.

13. The semiconductor light-emitting device according to claim 12, further comprising:

a first electrode electrically connected to the first conductive type semiconductor layer; and a second electrode electrically connected to the second conductive type semiconductor layer.

14. The semiconductor light-emitting device according to claim 13, further comprising:

a second groove formed on one side of the semiconductor light-emitting device facing away from the substrate, wherein the second groove exposes one side of the first conductive type semiconductor layer facing away from the substrate, and the first electrode is arranged on the first conductive type semiconductor layer in the second groove.

15. The semiconductor light-emitting device according to claim 13, further comprising:

a third groove extending to the first conductive type semiconductor layer on a back of the substrate, wherein the first electrode is arranged in the third groove and is electrically connected to the first conductive type semiconductor layer.

16. The semiconductor light-emitting device according to claim 13, further comprising:

a third groove extending to the first reflector on a back of the substrate, wherein the first reflector has electrical conductivity, and the first electrode is arranged in the third groove and is electrically connected to the first reflector.

17. The semiconductor light-emitting device according to claim 12, further comprising:

an ITO layer formed on one side of the light-emitting structure facing away from the first reflector, wherein the second reflector is Bragg reflector, and the second reflector is formed on a surface of the ITO layer facing away from the first reflector.

18. The semiconductor light-emitting device according to claim 12, wherein the light-emitting structure comprises an oxide layer, and the oxide layer comprises a low-resistance area and a high-resistance area surrounding the low-resistance area.

* * * * *